United States Patent
Dudon et al.

(10) Patent No.: US 11,306,385 B2
(45) Date of Patent: Apr. 19, 2022

(54) TOOLING FOR THE COATING OF LIPS

(71) Applicant: SAFRAN AIRCRAFT ENGINES, Paris (FR)

(72) Inventors: Laurent Paul Dudon, Moissy-Cramayel (FR); Mickaël Thiercelin, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 0 days.

(21) Appl. No.: 16/793,452

(22) Filed: Feb. 18, 2020

(65) Prior Publication Data
US 2020/0263286 A1  Aug. 20, 2020

(30) Foreign Application Priority Data

Feb. 19, 2019 (FR) ..................................... 1901640

(51) Int. Cl.
*C23C 4/129* (2016.01)
*C23C 4/10* (2016.01)
(Continued)

(52) U.S. Cl.
CPC .............. *C23C 4/129* (2016.01); *B05B 13/02* (2013.01); *B05B 13/0431* (2013.01);
(Continued)

(58) Field of Classification Search
CPC . B05B 13/02; B05B 13/0431; B05B 13/0422; B05B 13/0278; B05C 11/02;
(Continued)

(56) References Cited

U.S. PATENT DOCUMENTS 9,381,574 B1 * 7/2016 Jackson ................... B23B 27/10
2004/0146657 A1 * 7/2004 Heuser ..................... C23C 4/134
427/446
(Continued)

FOREIGN PATENT DOCUMENTS

EP  1291494 A1  3/2003
EP  3017898 A1  5/2016
(Continued)

OTHER PUBLICATIONS

Official Communication dated Nov. 12, 2019, in corresponding FR Application No. 1901640 (2 pages).

*Primary Examiner* — Dah-Wei D. Yuan
*Assistant Examiner* — Stephen A Kitt
(74) *Attorney, Agent, or Firm* — Bookoff McAndrews, PLLC

(57) ABSTRACT

Tooling for the coating of lips of a turbomachine rotor sector, comprising a support for a rotor sector, a centering plate adapted to be inserted into a rotor sector, said centering plate having a central housing, a tool, said tool comprising a centering arm, adapted to be inserted into the central housing of the centering plate, a torch, adapted to spray a ceramic material, a machining tool, said tooling being configured so as to position the tool relative to the rotor sector via the centering plate, and to simultaneously perform on the rotor sector a spraying of ceramic material and a machining on two distinct sectors of the lips.

8 Claims, 3 Drawing Sheets

(51) Int. Cl.
  *B05B 13/04* (2006.01)
  *B05B 13/02* (2006.01)
  *B05C 9/08* (2006.01)

(52) U.S. Cl.
  CPC ............ *B05B 13/0442* (2013.01); *B05C 9/08* (2013.01); *C23C 4/10* (2013.01)

(58) Field of Classification Search
  CPC ..... B05C 11/023; B05C 11/04; B05C 11/045; B05C 11/048; B05C 9/08–10; B05C 7/02
  See application file for complete search history.

(56) References Cited

U.S. PATENT DOCUMENTS

| | | | | |
|---|---|---|---|---|
| 2009/0232861 | A1* | 9/2009 | Wright | G06Q 30/018 424/405 |
| 2013/0149450 | A1* | 6/2013 | Feuerstein | B05C 13/02 427/282 |
| 2013/0180952 | A1* | 7/2013 | Berkebile | C23C 16/045 216/41 |
| 2019/0078463 | A1* | 3/2019 | Strock | F01D 5/34 |

FOREIGN PATENT DOCUMENTS

| | | | |
|---|---|---|---|
| EP | 3427892 A1 | | 1/2019 |
| FR | 3050671 A1 | | 11/2017 |
| JP | 2005334979 A | * | 12/2005 |
| JP | 2017 013140 A | | 1/2017 |

\* cited by examiner

[Fig. 1]
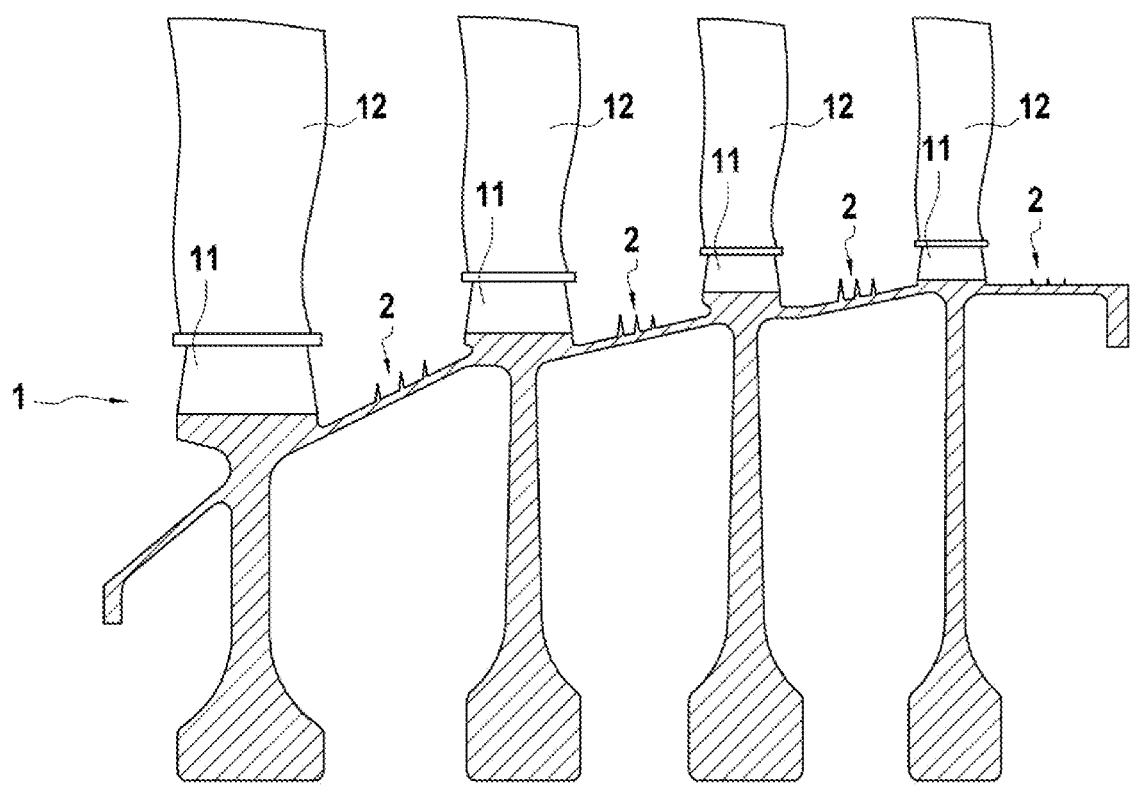
[Fig. 2]
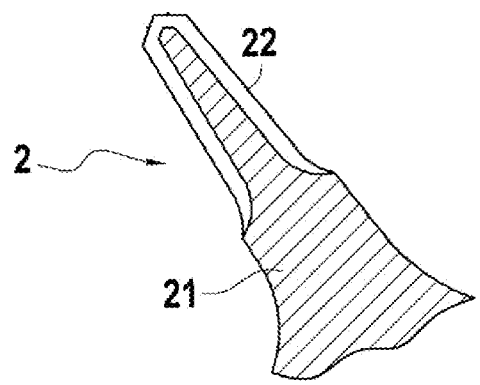

[Fig. 3]
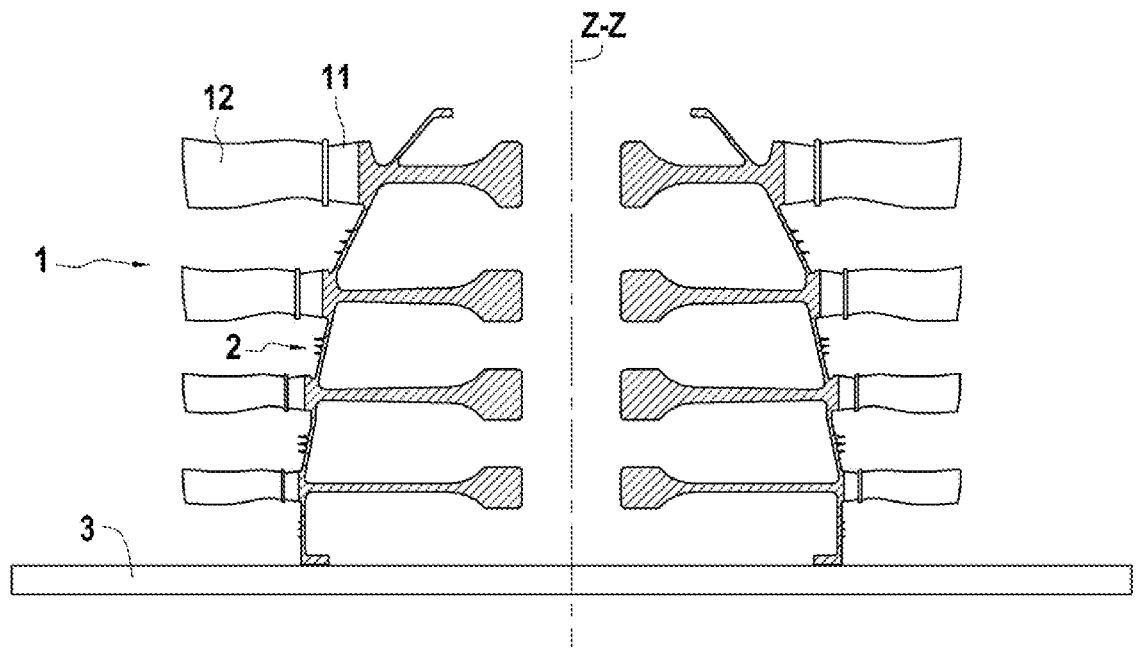
[Fig. 4]
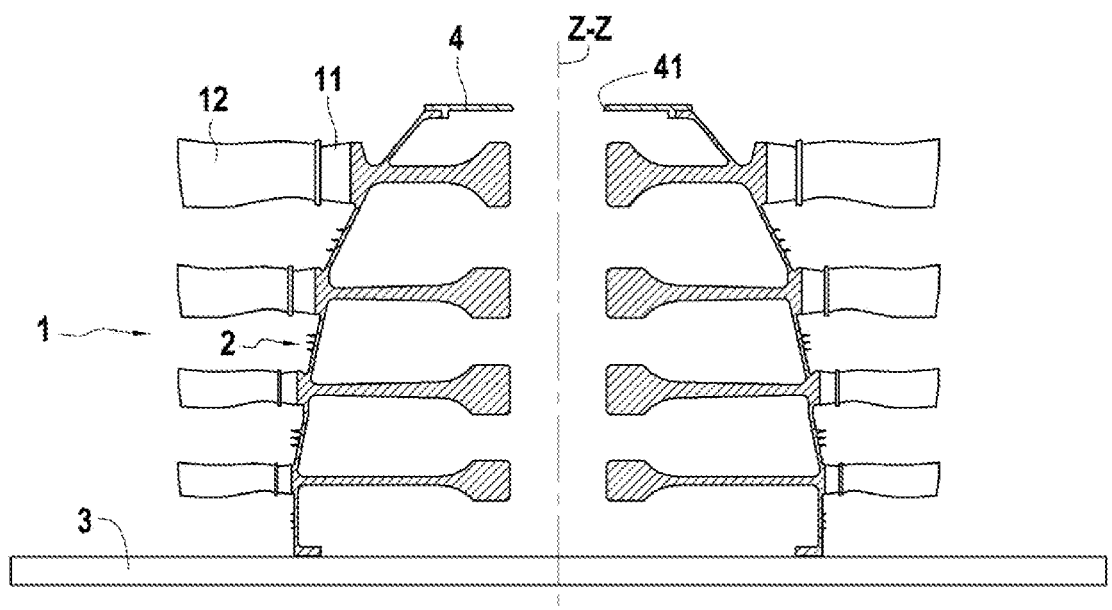

[Fig. 5]
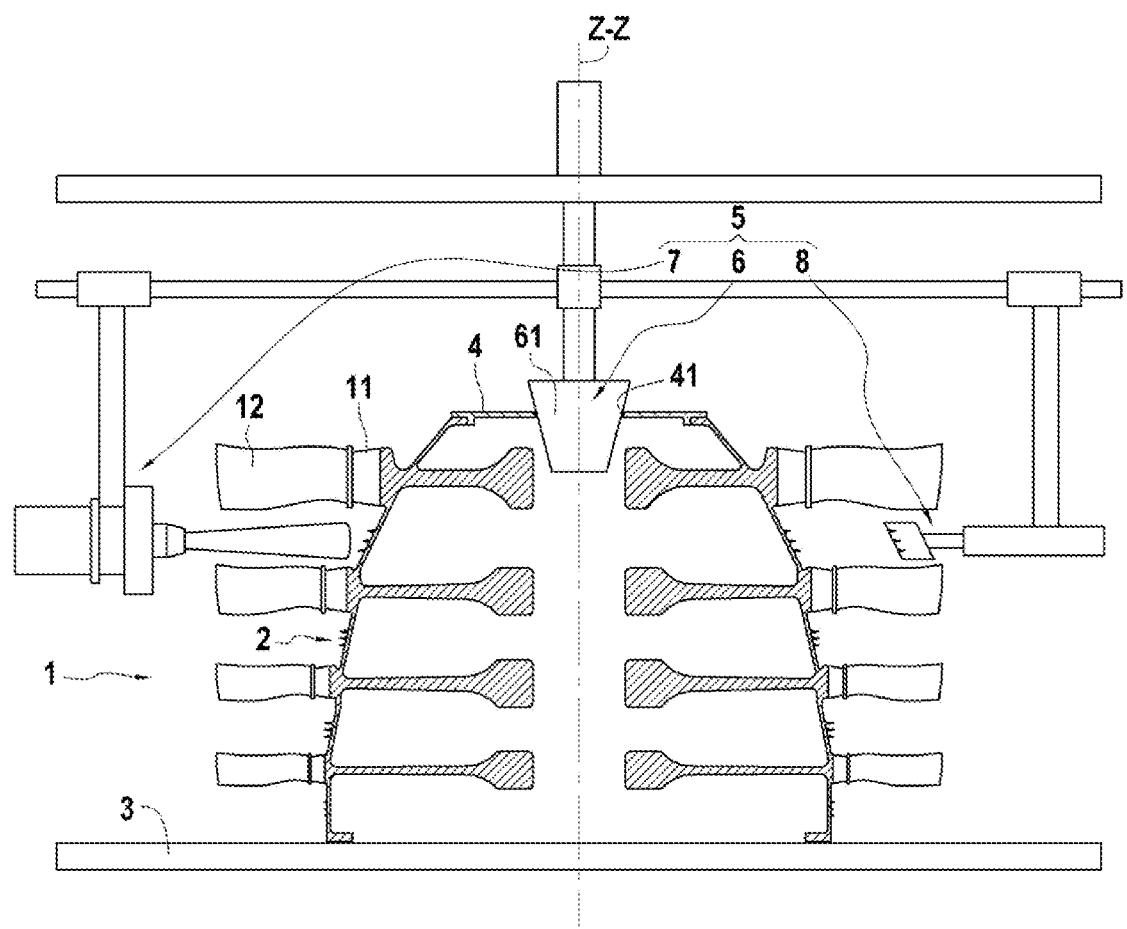

TOOLING FOR THE COATING OF LIPS

CROSS-REFERENCE TO RELATED APPLICATION

This application claims priority to French Patent Application No. 1901640, filed on Feb. 19, 2019, which is hereby incorporated by reference in its entirety.

TECHNICAL FIELD

The present invention relates to the field of turbojet engines and aims more specifically at producing tracks of abradable material for turbojet engines.

PRIOR ART

The turbojet engines comprise in known manner sealing portions commonly referred to as labyrinth seals, such seals being in particular advantageous for the achievement of sealing between rotating parts. The labyrinth seals comprise on the one hand a track of abradable material produced on one component and, on the other hand, a set of lips formed on another component and adapted to come into contact with the track of abradable material, this contact fulfilling a sealing function.

During operation, the contact between the lips and the track causes wear of the track due to the friction of the lips against said track. A recurring problem is the transfer of the abradable material from the track to the lips, as well as the wear of the coating of the lips, typically a ceramic material.

The wear resistance depends in particular on the method used for the deposition of the coating on the lips. The ceramic material is typically sprayed onto the lips. A determining parameter for the resistance of the coating is the spraying angle. Indeed, the more the spraying angle is closed, the weaker the adhesion of the ceramic material. In general, a spraying with a spraying angle of less than 30° will cause very low adhesion, due to the formation of porosities in chimneys that strongly affect the cohesion of the coating (more generally known as shading phenomenon). However, the geometry of the rotor segments, and particularly of the rotors provided with blades, is problematic for the spraying of the coating and allows using only very small spraying angles, in the order of 10°.

FIG. 1 represents an example of a rotor sector 1 of a turbomachine comprising a plurality of blade roots 11 between which lips 2 are positioned. The rotor sector 1 is a bladed sector; the blade roots 11 are each associated with a blade 12 extending radially with respect to a central axis (not represented) of the rotor sector 1. FIG. 2 is a detailed view of an example of lip 2, on which the lip body 21 and a coating 22 typically made of ceramic material are schematized.

It is easily understood from FIG. 1 that the presence of the blade roots 11 and of the blades 12 limits the possibilities of spraying of the coating on the lips 2.

Disclosure of the Invention

In order to respond at least partially to these problems, the present disclosure relates to a tooling for the coating of lips of a turbomachine rotor sector, comprising a support for a rotor sector, a centering plate adapted to be inserted into a rotor sector, said centering plate having a central housing, a tool comprising a centering arm, adapted to be inserted into the central housing of the centering plate, a torch, adapted to spray a ceramic material and a machining tool, said tooling being configured so as to position the tool relative to the rotor sector via the centering plate, and to simultaneously perform on the rotor sector a spraying of ceramic material and a machining on two distinct sectors of the lips.

According to one example, the torch and the machining tool are positioned on either side of the centering arm.

Optionally, the centering arm and the centering plate comprise rotating means allowing the relative rotation of the centering arm relative to the centering plate.

The support is then typically movable in rotation relative to the tool.

According to one example, the machining tool and the torch are each slidably mounted relative to the centering arm.

The machining tool comprises for example a cutting portion whose shape corresponds to the negative of lips to be machined.

The present disclosure also relates to a method for forming an abradable coating for lips of a turbomachine rotor sector, wherein: a turbomachine rotor sector comprising a plurality of lips is provided, the rotor sector is positioned on a support, a centering plate is secured to an open end of the rotor sector, the opposite end of the rotor sector being placed on the support, said centering plate having a central housing, a tool is positioned relative to the rotor sector, by inserting a centering arm in the central housing of the centering plate, said tool being provided with a torch and a machining tool, the rotor sector is driven in rotation relative to the tool, the torch is actuated so as to spray a ceramic material onto the lips of the rotor sector, the machining tool being positioned so as to machine said lips in parallel with the spraying of ceramic material by the torch.

Optionally, said method further comprises a step in which the machining tool is removed, and a step of spraying ceramic material onto the lips is carried out.

BRIEF DESCRIPTION OF THE DRAWINGS

The invention and its advantages will be better understood upon reading the detailed description given below of different embodiments of the invention given by way of non-limiting examples. This description refers to the pages of appended figures, on which:

FIG. 1 described above is a view of a rotor sector.

FIG. 2 described above is a detailed view of the rotor sector of FIG. 1.

FIG. 3 schematically represents a tooling and a method according to one aspect of the invention.

FIG. 4 schematically represents a tooling and a method according to one aspect of the invention.

FIG. 5 schematically represents a tooling and a method according to one aspect of the invention.

In all of the figures, the elements in common are identified by identical reference numbers.

DESCRIPTION OF THE EMBODIMENTS

FIG. 3, FIG. 4 and FIG. 5 schematically represent a tooling and a method according to one aspect of the invention, the different figures representing the successive steps of a method according to the invention.

FIG. 3 represents a rotor sector 1 of a turbomachine comprising a plurality of blade roots 11, a plurality of blades 12 as well as a plurality of lips 2 disposed between the successive blade roots 11. During a first step, the rotor sector 1 is positioned on a support 3; one end of the rotor sector 1

(relative to a central axis Z-Z of the rotor sector 1) thus being placed on the support 3, its opposite end being then free. The lips 2 are typically similar to those already presented with reference to FIG. 2.

FIG. 4 represents a next step, in which a centering plate 4 has been positioned on the free end of the rotor sector 1.

The centering plate 4 is fixed to flanges of the rotor sector 1, typically by bolting. The flanges of the rotor sector 1 and means for centering the centering plate 4 such as bores ensure the positioning, and in particular the centering of the centering plate 4 relative to the rotor sector 1. The centering plate 4 has a central housing 41 adapted to receive a centering arm which will be described later. The central housing is typically aligned and coaxial with respect to the central axis Z-Z of the rotor sector 1.

In a next step schematized in FIG. 5, a tool 5 is positioned relative to the rotor sector 1.

The tool 5 comprises a centering arm 6, a torch 7 and a machining tool 8. The tool 5 is secured to a stationary support.

The centering arm 6 has a free end 61 adapted to be inserted into the central housing 41 of the centering plate 4.

In the example illustrated, the central housing 41 is a frustoconical through bore. The free end 61 of the centering arm 6 also has a frustoconical shape, which allows an engagement and a centering with the frustoconical bore forming the central housing 41. It is understood that this embodiment is not limiting, and that the free end 61 of the centering arm 6 and the central housing 41 of the centering plate 4 can take any suitable shape as long as they allow engagement of the tool 5 relative to the centering plate 4.

The centering plate 4 or the centering arm 6 typically has an element allowing relative rotation of these two elements along an axis corresponding to the central axis Z-Z of the rotor sector 1. By way of example, the centering plate 4 or the centering arm 6 may have a bearing such as a roller bearing which ensures such a relative rotation of the centering plate 4 relative to the centering arm 6. The free end 61 of the centering arm 6 can for example be formed by a conical or frustoconical bearing which ensures both a centering and such a possibility of rotation along the axis of rotation of the bearing, which is then advantageously coaxial with the central axis Z-Z of the rotor sector 1. Alternatively, the centering plate 4 may have a bearing (for example conical or frustoconical bearing) at its central housing, in which the centering arm 6 is engaged.

As indicated above, the tool 5 comprises a torch 7 and a machining tool 8, which are each positioned on an arm, extending here from the centering arm 6, said arms being height-adjustable (along the central axis Z-Z) and length-adjustable (radially with respect to the central axis Z-Z) in order to ensure good positioning relative to the rotor sector 1.

The torch 7 performs a spraying of ceramic material, in order to form a coating on the lips 2 of the rotor sector 1. It is typically positioned on a first arm forming a movable portion of the tool 5, so as to be able to be positioned in front of lips 2 in order to perform a spraying of ceramic material. The torch 7 is thus typically movable in translation along a radial direction with respect to the central axis Z-Z of the rotor sector 1.

The machining tool 8 is positioned on a second arm forming a movable portion of the tool 5 so that it can be positioned facing lips 2 and perform a machining of the lips 2. The machining tool 8 is thus typically movable in translation along a radial direction with respect to the central axis Z-Z of the rotor sector 1. The machining tool 8 is typically associated with a damping system allowing it to be applied on the part to be machined while avoiding possible rebounds of the machining tool 8 on the rotor sector 1 to be machined during its rotation. The damping system typically comprises return means such as a spring, calibrated so as to apply a predetermined machining pressure to the lips 2.

The machining tool 8 typically has a shape complementary to that of the lips 2 to be machined, the accuracy of the machining tool 8 thus conditioning the accuracy of the machining carried out.

The machining tool 8 and the torch 7 are positioned so as to be facing distinct portions of the rotor sector 1. More precisely, if it is considered that the rotor sector 1 has several distinct sets of lips, each lip extending over the entire periphery of the rotor sector 1, then the machining tool 8 and the torch 7 are typically positioned so as to be simultaneously facing the same set of lips, but along two distinct angular sectors of the rotor sector 1. Thus, the torch 7 can perform a spraying of ceramic material on an angular sector of one or several lip(s), while the machining tool 8 will machine another angular sector of this or these same lip(s). The operations of machining by the machining tool 8 and of spraying by the torch 7 are therefore carried out simultaneously on two distinct areas of the rotor sector 1.

The tool 5 is typically configured such that the machining tool 8 and the torch 7 are positioned on either side of the central axis Z-Z of the rotor sector 1, that is to say on either side of a central axis of the centering arm 6, or even forming an angle of 180° with respect to the central axis Z-Z when the centering arm 6 is inserted into the central housing 41 of the centering plate 4.

Thus, once the tool 5 is positioned relative to the rotor sector 1, a spraying step is carried out in which the operations of spraying of the coating and machining of the lips 2 are carried out simultaneously. The rotor sector 1 is then driven in rotation, relative to the tool 5, typically by the support 3, for example at a speed in the order of 200 revolutions per minute. It is then possible to control the radial displacement of the machining tool 8 with respect to the central axis Z-Z in order to monitor the machining.

Optionally, an additional operation of spraying of ceramic material is then carried out alone, without a machining operation, in order to impart a roughness to the lips 2 equivalent to the roughness obtained by means of a conventional method, which allows ensuring good penetration of the lips 2 into a track of abradable material, typically having a honeycomb structure. This step can for example be carried out by retracting the machining tool 8.

The tooling and the method as presented thus have several advantages relative to the conventional toolings and methods.

First, it is understood that the tool 5 is here positioned directly relative to the part, namely relative to the rotor sector 1. More specifically, the use of a centering plate 4 which is fixed to the rotor sector 1 allows positioning of the tool 5 relative to the rotor sector 1, unlike the conventional toolings in which the tool is stationary and where the part is positioned relative to the tool. The fact of positioning the tool 5 relative to the part 1 makes it possible to dispense with the centering adjustments of the part, the centering being here carried out thanks to the cooperation between the centering plate 4 and the centering arm 6.

Furthermore, the fact of simultaneously carrying out the spraying and machining operations allows preventing or at least limiting the formation of porosities in chimneys. Indeed, the machining tool 8 erodes the coating between two deposition operations, which prevents the formation of porosities in chimneys insofar as the accumulations of coating are then eroded by the machining tool 8. The machining tool therefore allows leveling the coating between each material deposition operation by the torch 7.

In addition, the fact of simultaneously carrying out the spraying and machining operations makes it possible to dispense with subsequent machining operations; the lips 2 are here directly formed with a coating at the desired dimension.

Although the present invention has been described with reference to specific exemplary embodiments, it is obvious that modifications and changes can be made to these examples without departing from the general scope of the invention as defined by the claims. Particularly, individual characteristics of the various illustrated/mentioned embodiments can be combined in additional embodiments. Consequently, the description and the drawings should be considered in an illustrative rather than restrictive sense.

The invention claimed is:

1. A tooling for coating lips of a turbomachine rotor sector, comprising a support for a rotor sector, a centering plate adapted to be inserted into a rotor sector, said centering plate having a central housing, a tool, said tool comprising a centering arm, adapted to be inserted into the central housing of the centering plate, a torch, adapted to spray a ceramic material, a machining tool, said tooling being configured so as to position the tool relative to the rotor sector via the centering plate, and to simultaneously perform on the rotor sector a spraying of ceramic material and a machining on two distinct sectors of the lips;
   wherein the centering arm and the centering plate comprise rotating means allowing the relative rotation of the centering arm relative to the centering plate.

2. The tooling according to claim 1, wherein the torch and the machining tool are positioned on either side of the centering arm.

3. The tooling according to claim 1, wherein the support is movable in rotation relative to the tool.

4. The tooling according to claim 1, wherein the machining tool and the torch are each slidably mounted relative to the centering arm.

5. The tooling according to claim 1, wherein the machining tool has a cutting portion whose shape corresponds to a negative of lips to be machined.

6. A method for forming an abradable coating for lips of a turbomachine rotor sector using the tooling of claim 1, the method comprising:
   providing the turbomachine rotor sector comprising a plurality of lips;
   positioning the rotor sector on the support;
   securing the centering plate to an open end of the rotor sector, and placing an opposite end of the rotor sector on the support, said centering plate having a central housing, the tool, said tool comprising the centering arm, adapted to be inserted into the central housing of the centering plate, the torch, adapted to spray a ceramic material, the machining tool, said tooling being configured so as to position the tool relative to the rotor sector via the centering plate, and to simultaneously perform on the rotor sector a spraying of ceramic material and a machining on two distinct sectors of the lips; wherein the centering arm and the centering plate comprise rotating means allowing the relative rotation of the centering arm relative to the centering plate;
   positioning the tool relative to the rotor sector, by inserting the centering arm in the central housing of the centering plate, said tool being provided with the torch and the machining tool;
   driving the rotor sector in rotation relative to the tool; and
   actuating the torch to spray a ceramic material on the lips of the rotor sector, and positioning the machining tool to machine said lips parallel to the spraying of the ceramic material by the torch so that the machining of the lips and the spraying of the ceramic material are performed simultaneously on two distinct sectors of the lips.

7. The method according to claim 6, further comprising removing the machining tool, and spraying the ceramic material onto the lips.

8. A tooling for coating lips of a turbomachine rotor sector, comprising a support for a rotor sector, a centering plate adapted to be inserted into a rotor sector, said centering plate having a central housing, a tool, said tool comprising a centering arm, adapted to be inserted into the central housing of the centering plate, a torch, adapted to spray a ceramic material, a machining tool, said tooling being configured so as to position the tool relative to the rotor sector via the centering plate, and to simultaneously perform on the rotor sector a spraying of ceramic material and a machining on two distinct sectors of the lips, wherein the machining tool has a cutting portion whose shape corresponds to a negative of lips to be machined.

* * * * *